United States Patent
Yin et al.

(10) Patent No.: US 8,385,856 B2
(45) Date of Patent: Feb. 26, 2013

(54) METHOD AND DEVICE FOR CONTROLLING POWER AMPLIFICATION

(75) Inventors: Weimin Yin, Shenzhen (CN); Xikun Zhang, Shenzhen (CN); Jie Sun, Shenzhen (CN); Wei Chen, Shenzhen (CN); Yiping Sun, Shenzhen (CN); Yijun Sun, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 444 days.

(21) Appl. No.: 12/684,592

(22) Filed: Jan. 8, 2010

(65) Prior Publication Data

US 2010/0112966 A1 May 6, 2010

Related U.S. Application Data

(63) Continuation of application No. PCT/CN2008/071966, filed on Aug. 13, 2008.

(30) Foreign Application Priority Data

Aug. 17, 2007 (CN) .......................... 2007 1 0076519

(51) Int. Cl.
*H04B 1/04* (2006.01)
(52) U.S. Cl. .................................. 455/127.1; 455/127.3
(58) Field of Classification Search .................. 330/51, 330/124 R, 295, 296; 455/127.1, 127.2, 455/127.3, 127.5
See application file for complete search history.

(56) References Cited

U.S. PATENT DOCUMENTS

| 5,589,796 A | 12/1996 | Alberth, Jr. et al. |
| 6,118,343 A | 9/2000 | Winslow |
| 6,433,639 B1 | 8/2002 | Numanami et al. |
| 2005/0077965 A1* | 4/2005 | Li .................................. 330/298 |
| 2005/0208905 A1 | 9/2005 | Numanami et al. |
| 2007/0105512 A1 | 5/2007 | Wang |
| 2007/0176677 A1* | 8/2007 | Apel .............................. 330/51 |
| 2010/0112966 A1 | 5/2010 | Yin et al. |

FOREIGN PATENT DOCUMENTS

| CN | 1215260 A | 4/1999 |
| CN | 1719737 A | 1/2006 |
| CN | 1741640 A | 3/2006 |
| CN | 1747333 A | 3/2006 |
| CN | 1750385 A | 3/2006 |
| CN | 101114860 A | 1/2008 |
| CN | 101114860 B | 1/2008 |
| EP | 0 987 817 A1 | 3/2000 |
| WO | 2006071265 A1 | 7/2006 |

OTHER PUBLICATIONS

European Office Action, European Application No. 08 783 959.3-2215, Applicant: Huawei Technologies Co., Ltd., Dated: Nov. 11, 2010, 5 pages.

(Continued)

*Primary Examiner* — Blane J Jackson
(74) *Attorney, Agent, or Firm* — Slater & Matsil, L.L.P.

(57) ABSTRACT

A method and an NE for controlling power amplification are provided. The method for controlling power amplification includes: outputting a voltage signal according to the state of an NE; applying the voltage signal to a grid electrode or a base electrode of at least one power amplifier transistor in a power amplifier. Thus, static power dissipation of the power amplifier can be eliminated when no RF power is output, and the efficiency of the power amplifier can be improved by using the above method and NE.

16 Claims, 5 Drawing Sheets

OTHER PUBLICATIONS

European Office Action, European Application No. 08 783 959.3-2215, Applicant: Huawei Technologies Co., Ltd., Dated: Mar. 14, 2011, 4 pages.
Written Opinion of the International Searching Authority, International Application No. PCT/CN2008/071966, Dated Nov. 20, 2008, 6 pages.
Chinese Office Action, Application No. 2007100765198, Dated Jan. 22, 2010, 14 pages.
European Search Report, Application No. 08783959.3-2215/2180602, PCT/CN2008071966, Dated Jul. 13, 2010, 6 pages.
Extended European Search Report received in European Patent Application No. 12191726.4-2215 mailed Dec. 6, 2012, 3 pages.

* cited by examiner

METHOD AND DEVICE FOR CONTROLLING POWER AMPLIFICATION

CROSS-REFERENCE TO RELATED APPLICATIONS

This application is a continuation of International Application No. PCT/CN2008/071966, filed on Aug. 13, 2008, which claims priority to Chinese Patent Application No. 200710076519.8, filed on Aug. 17, 2007, both of which are hereby incorporated by reference in their entireties.

FIELD OF THE INVENTION

The present invention relates to the field of communications, and more particularly to a method and a device for controlling power amplification.

BACKGROUND OF THE INVENTION

A radio frequency (RF) power amplifier is a key component of a network equipment (NE) in a radio communication system. The RF power amplifier is substantially an energy converter, which converts Direct Current (DC) energy of a power source into RF energy for transmission through an antenna. A ratio of the RF power to the DC power provided by the power source is referred to as the efficiency η of the power amplifier, and the efficiency is an important factor of the power amplifier. Taking the power amplifier in a base station for example, the efficiency is directly associated with factors such as the power source, heat dissipation, size, fans, and noises of the base station system. A high efficiency of the power amplifier improves the reliability of the base station system and reduces the cost of the base station equipment. For a telecommunication operator, a high efficiency of the power amplifier can effectively reduce the cost of system operation and subsequent maintenance.

The efficiency η of a power amplifier is calculated according to the following formulae:

$$\eta = (\text{Power\_rf}/\text{Power\_dc}) \times 100\% \quad [1]$$

where Power_rf is an RF power, and Power_dc is a DC power; and $$\text{Power\_dc} = V_{dd} \times I_d \quad [2]$$

where $V_{dd}$ is a voltage provided by a DC power source, and $I_d$ is a current provided by the DC power source.

In the whole power conversion process, a part of the DC energy is inevitably converted into heat, which will be wasted. Therefore, the actual efficiency of the power amplifier is always lower than 100%.

In a current base station power amplifier, to consider the efficiency and linearity indexes comprehensively, a static working point of the power amplifier is normally set to Class A or Class AB, that is, a static working current of the power amplifier $I_{dq} > 0$ A Taking a laterally diffused metal oxide semiconductor (LDMOS) for example, the LDMOS is a power amplifier transistor widely applied at present. If a voltage bias of a power amplifier using the power amplifier transistor is in Class AB, and the power amplifier is in a saturated output state, the efficiency is the highest. However, with the decrease of the output power, the efficiency will be reduced gradually. That is, the ratio of the heat converted from the DC energy provided by the power source will rise with the decrease of the efficiency of the power amplifier.

When the power amplifier does not output any RF power, the dissipated DC power is as follows:

$$\text{Power\_dc} = V_{dd} \times I_{dq} \quad [3]$$

For the base station system, the state in which the power amplifier does not output any RF power appears frequently (for example, when no subscriber accesses the system). According to the above analysis, at this time, for a common Class A or Class AB amplifier, the static power is wasted, and the overall efficiency of the power amplifier is lowered.

To improve the overall efficiency of the power amplifier, the following solution is adopted in the prior art. When the power amplifier is in a state with no RF power output, a voltage of a drain electrode of the power amplifier transistor in the power amplifier is adjusted to 0 V. It is known from Formula [3] that, at this time, Power_dc=0 W, i.e. the dissipated DC power is 0 W.

Though the overall efficiency of the power amplifier is increased to some extent by using the above method, the inventors found the following problems from the solution.

1) The response time is long, the solution is applicable to few scenarios only, and the improvement to the efficiency of the power amplifier is limited.

Normally, the drain electrode of the power amplifier transistor operates in the state of high voltage (for example, 28 V) and large current (for example, 10 A), so the power supply unit thereof must be a power source capable of providing a high power. Limited by factors such as the charging and discharging of high-capacitance capacitors and the soft-start mechanism to ensure security, the time for establishing or disabling the output voltage of such a power source is often several seconds or even several tens of seconds.

However, in normal situations, time periods required by services of the base station system are much shorter than one second. For example, in a Global System for Mobile Communications (GSM), the timeslot period of each user is only 577 μs. Subscribers may access (the power amplifier needs to switch on) or not access (the power amplifier needs to switch off) the GSM system in a timeslot period, while the solution of controlling the voltage of a drain electrode cannot track such a fast change. To ensure normal communications, the voltage on the drain port of the power amplifier transistor must remain at the normal operating voltage without changes for a long time, and thus a part of the static power will be dissipated In view of the above, the solution of controlling the voltage of a drain electrode is applicable to very few scenarios in practice. Normally, this solution is adopted only when no subscriber accesses the system for a long time at night. Therefore, the improvement to the efficiency of the power amplifier is unobvious, and the power-saving effect is limited.

2) The control circuit is complicated with a high cost and low reliability.

The solution of controlling the voltage of a drain electrode deals with signals with a high voltage and large current, so many high-power elements are needed. Therefore, the circuit implementation is complicated, the cost is high, and the reliability is low, which may easily cause potential quality problems.

SUMMARY OF THE INVENTION

Accordingly, the embodiments of present invention provide a method and a device for controlling power amplification, a base station, and a terminal, so as to improve the efficiency of a power amplifier by reducing static power dissipation in a time period without output power.

In an embodiment of the present invention, a method for controlling power amplification is provided. The method includes the following steps.

Outputting a voltage signal according to the state of an NE;

Applying the voltage signal to a grid electrode or a base electrode of at least one power amplifier transistor in a power amplifier.

In an embodiment of the present invention, a transmitter is provided. The transmitter includes a main control unit, a voltage control unit, and a power amplifier unit.

The main control unit is adapted to obtain the state of an NE where the transmitter is located, and send a voltage control signal according to the state.

The voltage control unit is adapted to output a voltage signal according to the voltage control signal received from the main control unit.

The power amplifier unit is adapted to switch on or switch off according to the voltage signal applied to a grid electrode or a base electrode of at least one power amplifier transistor therein by the voltage control unit.

In an embodiment of the present invention, a base station is provided. The base station includes a main control unit, a voltage control unit, and a power amplifier unit.

The main control unit is adapted to obtain the state of the base station, and send a voltage control signal according to the state.

The voltage control unit is adapted to output a voltage signal according to the voltage control signal received from the main control unit.

The power amplifier unit is adapted to switch on or switch off according to the voltage signal applied to a grid electrode or a base electrode of at least one power amplifier transistor in the power amplifier unit.

In an embodiment of the present invention, a terminal is provided. The terminal includes a main control unit, a voltage control unit, and a power amplifier unit.

The main control unit is adapted to obtain the state of the terminal, and send a voltage control signal according to the state.

The voltage control unit is adapted to output a voltage signal according to the voltage control signal received from the main control unit.

The power amplifier unit is adapted to switch on or switch off according to the voltage signal applied to a grid electrode or a base electrode of at least one power amplifier transistor therein by the voltage control unit.

In an embodiment of the present invention, a device for controlling power amplification is provided. The device includes a main control unit and a voltage control unit.

The main control unit is adapted to obtain the state of an equipment, and send a voltage control signal according to the state.

The voltage control unit is adapted to output a voltage signal to a grid electrode or a base electrode of at least one power amplifier transistor in a power amplifier unit according to the voltage control signal.

Compared with the prior art, the embodiments of the present invention achieve the following beneficial effects.

The response time is short, the solution is applicable to more scenarios, and the power amplification efficiency is improved to the maximum extent. The grid electrode of the power amplifier transistor normally operates in the state of low voltage (for example, 3 V) and small current (for example, 5 mA), the circuit does not have capacitors with high capacitance, and the charging/discharging time is at μs level or even lower. Therefore, the power amplifier transistor can switch on or switch off at the same speed, which is advantageous to a fast response to the control signal. Through the control over the grid electrode or the base electrode of the power amplifier transistor, static power dissipation at a timeslot level is reduced, so as to avoid energy dissipation to the maximum extent.

The control circuit is simple, the cost is low, and the reliability is high. The voltage control unit processes low-voltage and small-current signals. The circuit implementation is simple, the cost is low, and the reliability is high.

DETAILED DESCRIPTION OF THE EMBODIMENTS

In the embodiments of the present invention, a voltage signal is output to a grid electrode or a base electrode of a power amplifier transistor according to the state of an NE, and the power amplifier transistor can switch on or switch off according to the state of the NE under the control of the voltage signal, so as to improve the efficiency of a power amplifier.

The technical solutions of the present invention are described in detail below in the embodiments with reference to some accompanying drawings.

Figure 1:
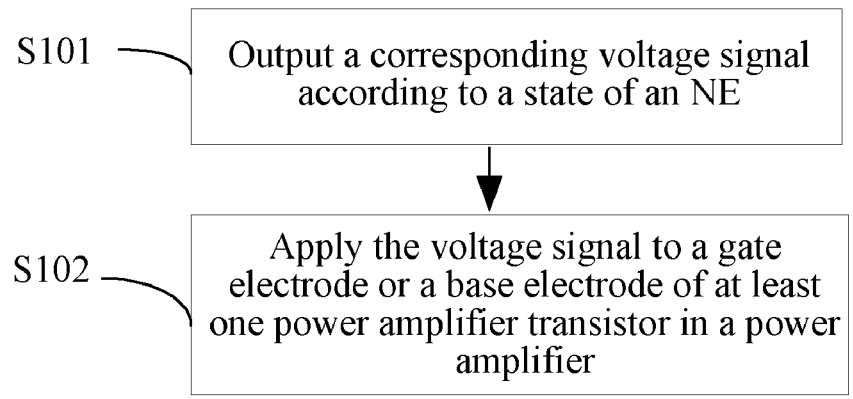
FIG. 1 is a flow chart of a method for controlling power amplification according to a first embodiment of the present invention.

A method for controlling power amplification is provided in a first embodiment of the present invention. Referring to FIG. 1, the method includes the following steps.

Step S101, outputting a voltage signal according to the state of an NE.

In this step, information related to the NE is obtained firstly. The information includes signaling or service information or external control signal or internal clock signal of the NE, and the state of the NE can be determined according to one or multiple combinations of the information. The NE may be in an Idle or a Busy state. The Idle state indicates that the NE is not required to output an RF signal, for example, the NE is not accessed by any subscriber or in an idle timeslot, or receives a control signal for enabling the power amplifier to switch off. The Busy state indicates that the NE is required to output an RF signal, for example, the NE is accessed by subscribers, in a non-idle timeslot, or receives a control signal for enabling the power amplifier to switch on. Taking a base station for example, when a terminal accesses the base station, if a channel type assigned in the signaling is a main broadcast control channel (BCCH) or a packet data traffic channel (PDTCH), it is determined that the NE is in the Busy state, that is, the NE needs to output an RF signal.

After the state of the NE is obtained, the voltage signal is output according to the state. When the system is in the Busy state, the voltage signal corresponding to the Busy state is output; and when the system is in the Idle state, the voltage signal corresponding to the Idle state is output. The value of the voltage signal varies with different power amplifier transistors. For example, if the power amplifier transistor is an N-channel LDMOS, the voltage signal corresponding to the Busy state may be 2 V to 5 V, and the voltage signal corresponding to the Idle state may be 0 V to 2 V. Besides, if the power amplifier transistor is an N-channel depletion-mode gallium arsenide metal-semiconductor field effect transistor (GaAs MESFET), the voltage signal corresponding to the Busy state may be −4 V to 0 V, and the voltage signal corresponding to the Idle state may be −5 V to −4 V.

Step S102, applying the voltage signal to a grid electrode or a base electrode of at least one power amplifier transistor in a power amplifier When the NE is in the Busy state, the voltage signal corresponding to the Busy state is applied to the grid electrode or the base electrode of one or more power amplifier transistors in the power amplifier. At this time, the power amplifier transistor works in an amplification range, and the power amplifier has RF power output. When the NE is in the Idle state, the voltage signal corresponding to the Idle state is applied to the grid electrode or the base electrode of one or more power amplifier transistors in the power amplifier. At this time, the power amplifier transistor switches off with no RF power output, and thus does not have static power dissipation.

After the method of the present invention is described in the above embodiment, the difference between DC power dissipation of the power amplifier in the method of the present invention and that of the power amplifier in the prior art is given below with specific examples.

Figure 2:
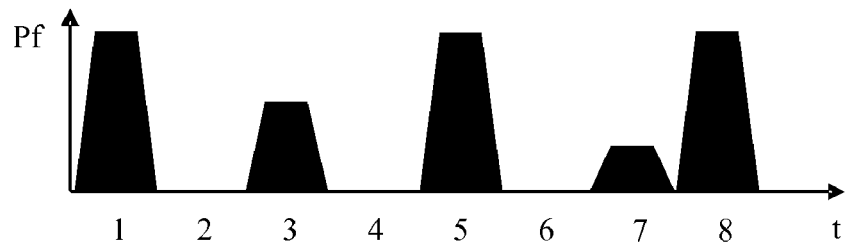
FIG. 2 is a schematic view of the relationship between RF power output of a power amplifier and timeslots according to the first embodiment of the present invention.

It is assumed that FIG. 2 is a schematic view of the relationship between the RF power output of a Class A or Class AB power amplifier in eight timeslot periods and timeslots according to the first embodiment of the present invention, in which the Pf axis represents the RF output power, and the t axis represents the timeslots. The timeslots 2, 4, and 6 are idle timeslots, during which the power amplifier does not have RF power output; while the timeslots 1, 3, 5, 7, and 8 are non-idle timeslots, during which the power amplifier has RF power output.

Figure 3:
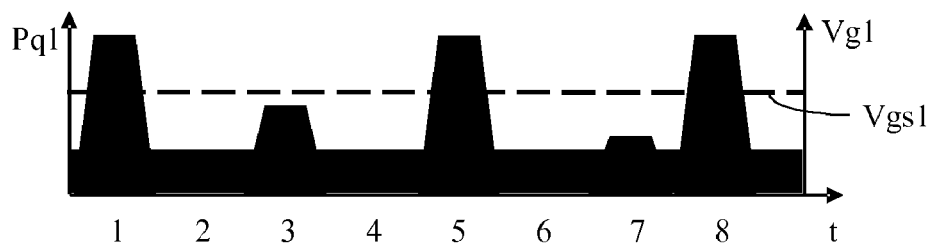
FIG. 3 is a schematic view of the relationship between power dissipation of a conventional Class AB power amplifier in the prior art and timeslots.

FIG. 3 is a schematic view of the relationship between the power dissipation of a conventional Class AB power amplifier in the prior art and the timeslots in the RF power output state as shown in FIG. 2. In FIG. 3, the Pq1 axis represents the power dissipation of the power amplifier, the Vg1 axis represents a grid electrode bias voltage of the power amplifier transistor in the power amplifier, and the dashed line Vgs1 represents a current grid bias voltage of the power amplifier transistor. As shown in FIG. 3, Vgs1 is constant (normally between 2 V and 5 V), and the power dissipation is not zero in the idle timeslots 2, 4, and 6.

Figure 4:
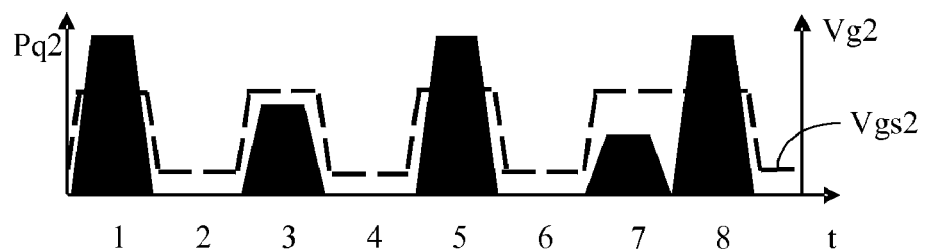
FIG. 4 is a schematic view of the relationship between power dissipation of the power amplifier and timeslots according to the first embodiment of the present invention.

FIG. 4 is a schematic view of the relationship between the power dissipation of the Class A or Class AB power amplifier utilizing the method embodiment of the present invention and the timeslots in the RF power output state as shown in FIG. 2. In FIG. 4, the Pq2 axis represents the power dissipation of the power amplifier, the Vg2 axis represents a grid electrode bias voltage of the power amplifier transistor in the power amplifier, and the dashed line Vgs2 represents a current grid electrode bias voltage of the power amplifier transistor. As shown in FIG. 4, Vgs2 varies with the state of the timeslots. In the idle timeslots 2, 4, and 6, Vgs2 is between 0 V and 2 V, the power amplifier transistor switches off, and the power dissipation of the power amplifier is zero; while in the non-idle timeslots 1, 3, 5, 7, and 8, Vgs2 is between 2 V and 5 V, the power amplifier transistor works in an amplification range, and the power amplifier has RF power output.

If the power amplifier transistor in the power amplifier is a bipolar junction transistor (BJT), the efficiency of the power amplifier can still be improved by using the above method, and the difference lies in that Vgs2 represents a base bias voltage of the BJT, and the value of Vgs2 in the idle and non-idle timeslots can be adjusted according to specific parameters of the transistor.

As described above, the voltage of the voltage signal (for example, Vgs2) is relatively low, so that the voltage control circuit does not need high-capacitance capacitors or high-inductance inductors, and the response time can meet the requirements for the timeslot period of the subscribers. By using the method embodiment of the present invention, the power dissipation of the power amplifier is much lower than that of the conventional Class AB power amplifier in the prior art, so as to significantly improve the efficiency of the power amplifier.

The method for controlling power amplification is applicable to an RF transmitter, and is also applicable to an NE including, but not limited to, a base station, a wireless terminal, a server, a switch, and a base station controller.

Figure 5:
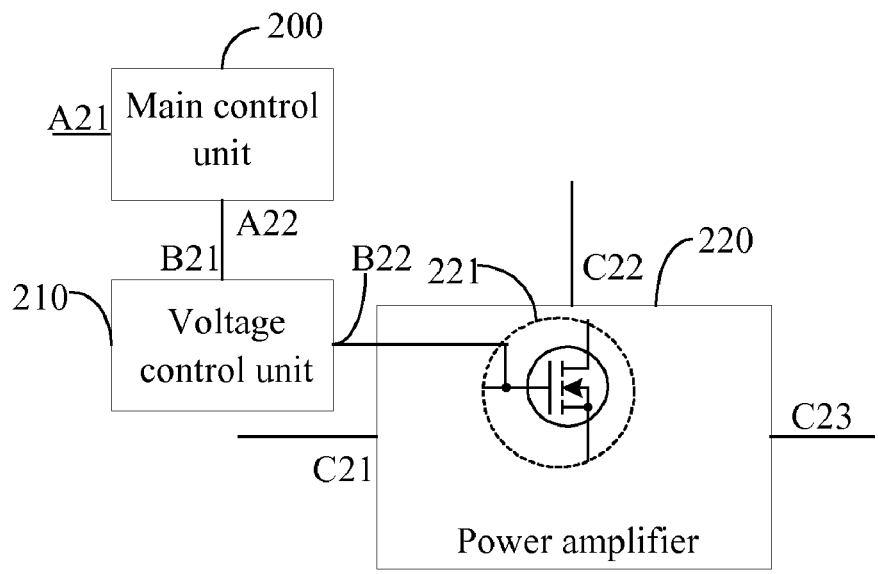
FIG. 5 is a schematic view of a system for controlling power amplification according to a second embodiment of the present invention, in which a voltage control unit is connected to a grid of a power amplifier transistor.

A system for controlling power amplification is provided in a second embodiment of the present invention. Referring to FIG. 5, the system includes a main control unit 200, a voltage control unit 210, and a power amplifier unit, in which the power amplifier unit includes a power amplifier 220.

Figure 6:
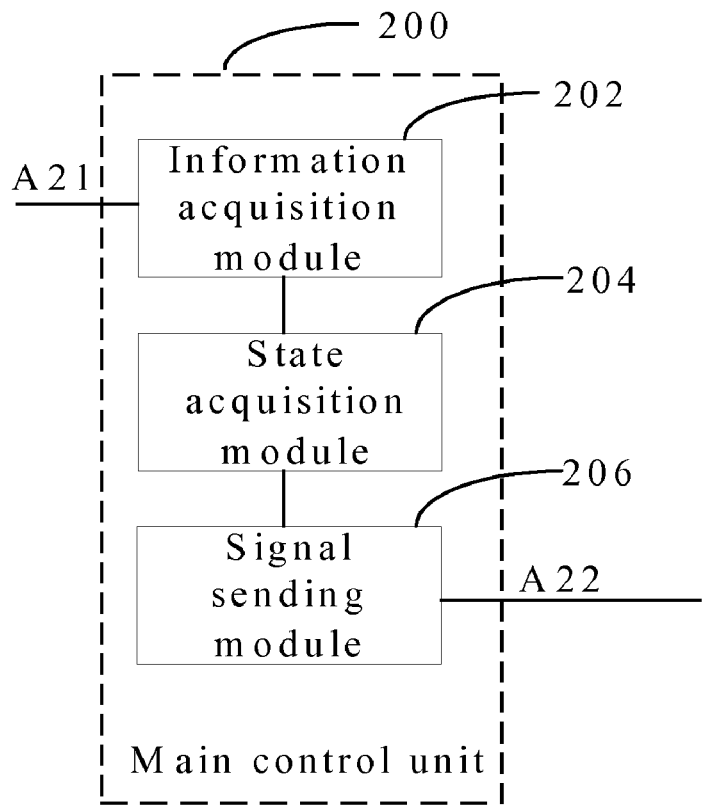
FIG. 6 is a schematic view of a main control unit according to the second embodiment of the present invention.

Referring to FIG. 6, the main control unit 200 is adapted to obtain the state of an NE, and send a voltage control signal according to the state.

The main control unit 200 includes an information acquisition module 202, a state acquisition module 204, and a signal sending module 206.

The information acquisition module 202 is adapted to acquire information related to the NE through a port A21. The information includes signaling or service information or external control signals or internal clock signals of the NE. Priorities of the signals may be set in the main control unit, for example, the priority of the external control signals is set to the highest, and thus, when a fault alarm signal or a signal for forcedly turning off the transmitter or power amplifier is received, even if the NE is in the non-idle timeslots as indicated by the signaling, the main control unit still determines the state of the NE as Idle according to the priority.

The state acquisition module 204 is adapted to determine a current state of the NE according to the above information. The NE may be in an Idle state or a Busy state. The Idle state indicates that the NE is not required to output an RF signal, for example, the NE is not accessed by any subscriber, in an idle timeslot, or receives a control signal for enabling the power amplifier to switch off. The Busy state indicates that the NE is required to output an RF signal, for example, the NE is accessed by subscribers, in a non-idle timeslot, or receives a control signal for turning on the power amplifier.

The signal sending module 206 is adapted to send the voltage signal according to the state of the NE. For example, the voltage control signal corresponding to the Idle state is represented by a logic voltage "0", and the voltage control signal corresponding to the Busy state is represented by a logic voltage "1". Further, an inverse logic expression may also be adopted, that is, the voltage control signal corresponding to the Idle state is represented by a logic voltage "1", and the voltage control signal corresponding to the Busy state is represented by a logic voltage "0". The voltage control signal is output from a port A22.

The main control unit 200 may be an integrated chip or a functional module of an integrated chip, for example, a functional module integrated in a control chip of a wireless terminal such as a mobile phone. The main control unit 200 may also be a part of a base station controller, and the voltage control signal is directly sent to a transmitter on a base station side through a signaling channel by the base station controller. The main control unit 200 may also be directly integrated on a board of a transmitter.

The voltage control unit 210 is connected to the main control unit 200, and adapted to receive the voltage control signal from the main control unit 200 through a port B21, obtain the voltage signal according to the voltage control signal, and apply the obtained voltage signal to a grid electrode or a base electrode of a power amplifier transistor 221 in the power amplifier 220 through a port B22. The value of the voltage signal varies for different power amplifier transistors. For example, when the power amplifier transistor is an N-channel LDMOS, the voltage signal corresponding to the voltage control signal "1" (the Busy state) may be 2 V to 5 V, and the voltage signal corresponding to the voltage control signal "0" (the Idle state) may be 0 V to 2 V. When the power amplifier transistor is an N-channel depletion-mode GaAs MESFET, the voltage signal corresponding to the voltage control signal "1" (the Busy state) may be −4 V to 0 V, and the voltage signal corresponding to the voltage control signal "0" (the Idle state) may be −5 V to −4 V. The voltage control unit may be formed by an analog switch circuit or a digital-to-analog converter circuit. The voltage control unit may be set separately or integrated in the main control unit as a functional module.

The power amplifier 220 is adapted to switch on or switch off according to the bias voltage signal applied to the grid electrode or a base electrode of the power amplifier transistor 221 therein. A port C21 of the power amplifier 220 is adapted to receive an RF signal, a port C22 is adapted to connect a constant power supply voltage $V_{dd}$, and a port C23 is adapted to output the RF signal.

The power amplifier 220 may be a Class A or Class AB amplifier, and the power amplifier transistor 221 therein includes, but is not limited to, an LDMOS, a GaAs MESFET, a BJT, a junction field effect transistor (JFET), or a gallium nitride (GAN) transistor.

Figure 7:
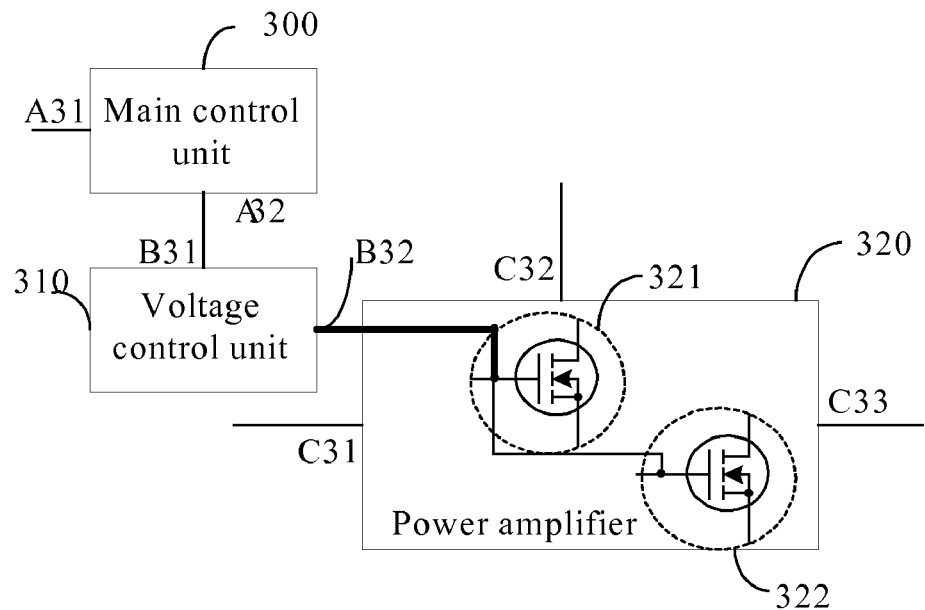
FIG. 7 is a schematic view of the system for controlling power amplification according to the second embodiment of the present invention, in which the voltage control unit is connected to grids of two power amplifier transistors.

When the power amplifier is formed by multiple power amplifier transistors, the voltage control unit enables the power amplifier to switch on or switch off by controlling the grid voltage or base voltage of the one or multiple power amplifier transistors in the power amplifier. As shown in FIG. 7, a main control unit 300 obtains information related to an NE through a port A31, a port A32 sends a voltage control signal to a port B31 of a voltage control unit 310, the voltage control unit 310 responds to the signal, and a port B32 outputs a voltage signal to a grid electrode or a base electrode of a power amplifier transistor 321 and a grid electrode or a base electrode of a power amplifier transistor 322 in a power amplifier 320. A port C31 of the power amplifier 320 is adapted to receive an RF signal, a port C32 is adapted to connect a constant power supply voltage $V_{dd}$, and a port C33 is adapted to output the RF signal. In practice, the power amplifier transistors connected to and controlled by the voltage control unit may be determined according to the internal structure of the power amplifier. When multiple power amplifier transistors need to be controlled, multiple voltage signals are used, which vary according to specific conditions of the power amplifier.

As the voltage control unit processes low-voltage and low-current signals, the circuit structure is simple, and the manufacturing cost is low. Moreover, as the circuit includes fewer components, the stability of the circuit is also improved.

The system for controlling power amplification is applicable to an RF transmitter, and is also applicable to an NE such as a base station or a wireless terminal. When the system for controlling power amplification is applied in the wireless terminal, in order to simplify the equipment connection and improve the integration level, the voltage control unit may be directly integrated in the main control unit, or the main control unit, the voltage control unit, and the power amplifier unit may be integrated in a chip or in a functional module of a chip.

Figure 8:
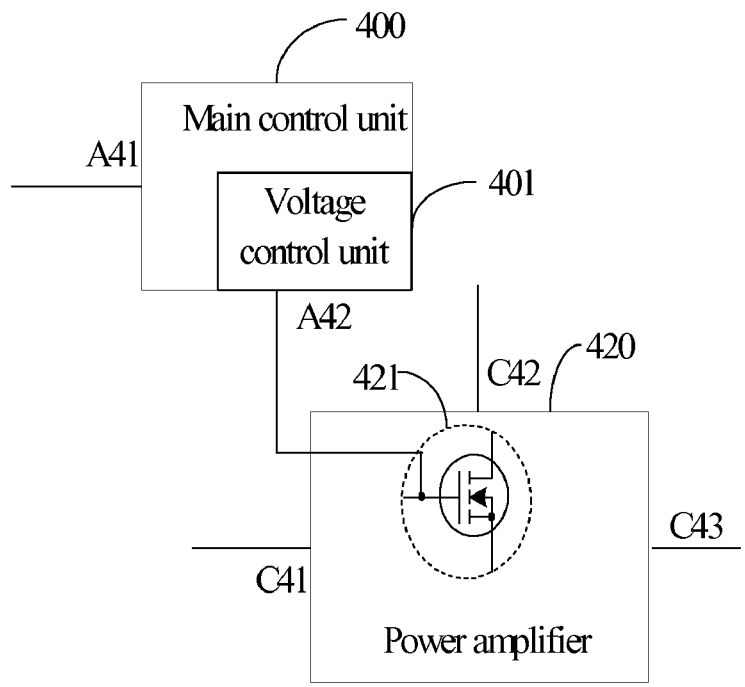
FIG. 8 is a schematic view of a system for controlling power amplification according to a third embodiment of the present invention, in which a voltage control unit is integrated in a main control unit.

A system for controlling power amplification is provided in a third embodiment of the present invention, in which a voltage control unit is integrated in a main control unit. Referring to FIG. 8, the system includes a main control unit 400 and a power amplifier unit, and the power amplifier unit includes a power amplifier 420.

A voltage control unit 401 is integrated in the main control unit 400. A port A41 of the main control unit 400 is an information input port adapted to obtain information related to an NE. The information includes at least one of signaling, service information, external control signals, and internal clock signals of the NE. A current state of the NE is determined according to the above information. A bias voltage signal is applied to a grid electrode or a base electrode of a power amplifier transistor 421 according to the current state of the NE.

The NE may be in an Idle state or a Busy state. The Idle state indicates that the NE is not required to output an RF signal, for example, the NE is not accessed by any subscriber, in an Idle timeslot, or receives a control signal for turning off the power amplifier. The Busy state indicates that the NE is required to output an RF signal, for example, the NE is accessed by subscribers, in a non-idle timeslot, or receives a control signal for turning on the power amplifier. Taking a GSM mobile terminal for example, in the process that the terminal establishes connections, the network side delivers a service channel assignment message, in which sequence numbers of timeslots available to the terminal are specified. The main control unit obtains the message, and determines whether the terminal is in a Busy state according to the message and the internal clock when the specified timeslots arrive.

The voltage control unit 401 integrated in the main control unit 400 outputs a voltage signal according to the state of the NE, and the voltage signal is applied to the grid electrode or the base electrode of the power amplifier transistor 421 through a port A42. The value of the voltage signal varies for different power amplifier transistors. For example, if the power amplifier transistor is an N-channel LDMOS, the voltage signal corresponding to the Busy state of the NE may be 2 V to 5 V, and the voltage signal corresponding to the Idle state may be 0 V to 2 V. If the power amplifier transistor is an N-channel depletion-mode GaAs MESFET, the voltage signal corresponding to the Busy state may be −4 V to 0 V, and the voltage signal corresponding to the Idle state may be −5 V to −4 V.

The power amplifier 420 is adapted to switch on or switch off according to the voltage signal applied to the grid electrode or the base electrode of the power amplifier transistor 421 therein. A port C41 of the power amplifier 420 is adapted to receive an RF signal, a port C42 is adapted to connect a constant power supply voltage $V_{dd}$, and a port C43 is adapted to output the RF signal.

The power amplifier 420 may be a Class A or Class AB amplifier, and the power amplifier transistor 421 therein includes, but is not limited to, an LDMOS, a GaAs MESFET, a BJT, a JFET, or a GAN transistor.

The voltage control unit is directly integrated in the main control unit. Thus, the integration level of the equipment is improved, the configuration and circuit connection are simplified, and the delay of the control signal is significantly shortened to make the response to the voltage signal more timely. In addition, the function of the main control unit 400 may be realized through a dedicated integrated circuit, a central processing unit (CPU), or a field programmable gate array (FPGA).

The system for controlling power amplification is applicable to an RF transmitter, and is also applicable to an NE such as a base station or a wireless terminal.

According to actual requirements, the voltage control unit may also be directly integrated in the power amplifier.

Figure 9:
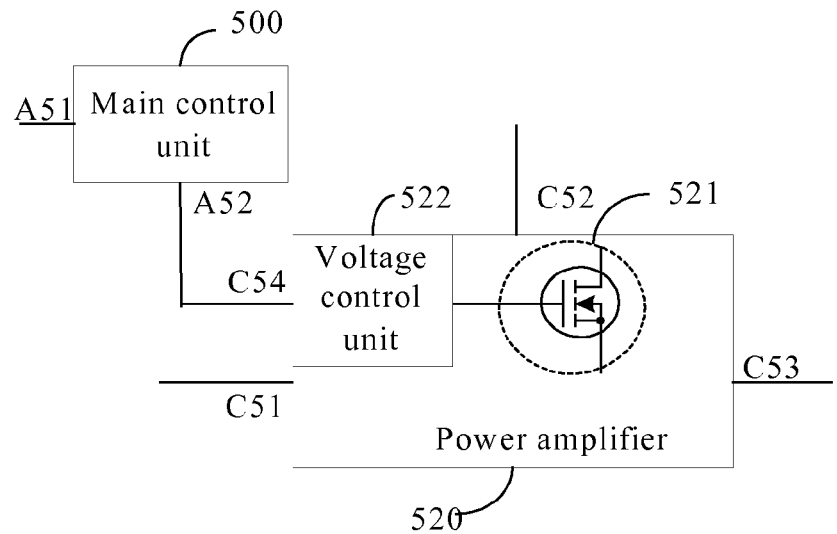
FIG. 9 is a schematic view of a system for controlling power amplification according to a fourth embodiment of the present invention, in which a voltage control unit is integrated in a power amplifier.

A system for controlling power amplification is provided in a fourth embodiment of the present invention, in which a voltage control unit is integrated in a power amplifier. Referring to FIG. 9, the system includes a main control unit 500 and a power amplifier 520.

A port A51 of the main control unit 500 is an information input port adapted to obtain information related to an NE. The information includes at least one of signaling, service information, external control signals, and internal clock signals of the NE. A current state of the NE is determined according to the above information.

The NE may be in an Idle state or a Busy state. The Idle state indicates that the NE is not required to output an RF signal, for example, the NE is not accessed by any subscriber, in an idle timeslot, or receives a control signal for turning off the power amplifier. The Busy state indicates that the NE is required to output an RF signal, for example, the NE is accessed by subscribers, in a non-idle timeslot, or receives a control signal for turning on the power amplifier.

The main control unit 500 sends a voltage control signal according to the state of the NE. For example, the voltage control signal corresponding to the Idle state is represented by a logic voltage "0", and the voltage control signal corresponding to the Busy state is represented by a logic voltage "1". Further, an inverse logic expression may also be adopted, that is, the voltage control signal corresponding to the Idle state is represented by a logic voltage "1", and the voltage control signal corresponding to the Busy state is represented by a logic voltage "0". The voltage control signal is output from a port A52. The main control unit 500 may be an integrated chip or a functional module of an integrated chip. The main control unit may also be a part of a base station controller, and the voltage control signal is directly sent to a transmitter on a base station side through a signaling channel by the base station controller. The main control unit may also be integrated in a baseband signal processing subsystem of a base station, or directly integrated on a board of a transmitter.

A voltage control unit 522 is integrated in the power amplifier 520. A port C54 of the voltage control unit 522 receives the voltage control signal from the main control unit 500. The voltage control unit 522 responds to the voltage control signal, and applies a voltage signal to a grid electrode or a base electrode of a power amplifier transistor 521. The power amplifier transistor switches on or switches off according to the voltage signal. The value of the voltage signal varies for different power amplifier transistors. For example, when the power amplifier transistor is an N-channel LDMOS, the voltage signal corresponding to the voltage control signal "1" (the Busy state) may be 2 V to 5 V, and the voltage signal corresponding to the voltage control signal "0" (the Idle state) may be 0 V to 2V. If the power amplifier transistor is an N-channel depletion-mode GaAs MESFET, the voltage signal corresponding to the voltage control signal "1" (the Busy state) may be −4 V to 0 V, and the voltage signal corresponding to the voltage control signal "0" (the Idle state) may be −5 V to −4 V. A port C51 of the power amplifier 520 is adapted to receive an RF signal, a port C52 is adapted to connect a constant voltage $V_{dd}$ of power source, and a port C53 is adapted to output the RF signal.

The power amplifier 520 may be a Class A or Class AB amplifier, and the power amplifier transistor 521 therein includes, but is not limited to, an LDMOS, a GaAs MESFET, a BJT, a JFET, or a GAN transistor. The power amplifier 520 may also be an integrated circuit, and the voltage control unit therein is implemented through a digital-to-analog converter circuit or an analog switch circuit.

The voltage control unit is integrated in the power amplifier unit (which includes the power amplifier). Thus, the universality of the power amplifier unit is improved. Moreover, as the transmission path of the voltage signal is short, the interference to the voltage signal caused by other signals is effectively prevented. Therefore, this configuration is applicable when the main control unit is at a long distance to the power amplifier.

The system for controlling power amplification is applicable to an RF transmitter, and is also applicable to an NE such as a base station or a wireless terminal.

Figure 10:
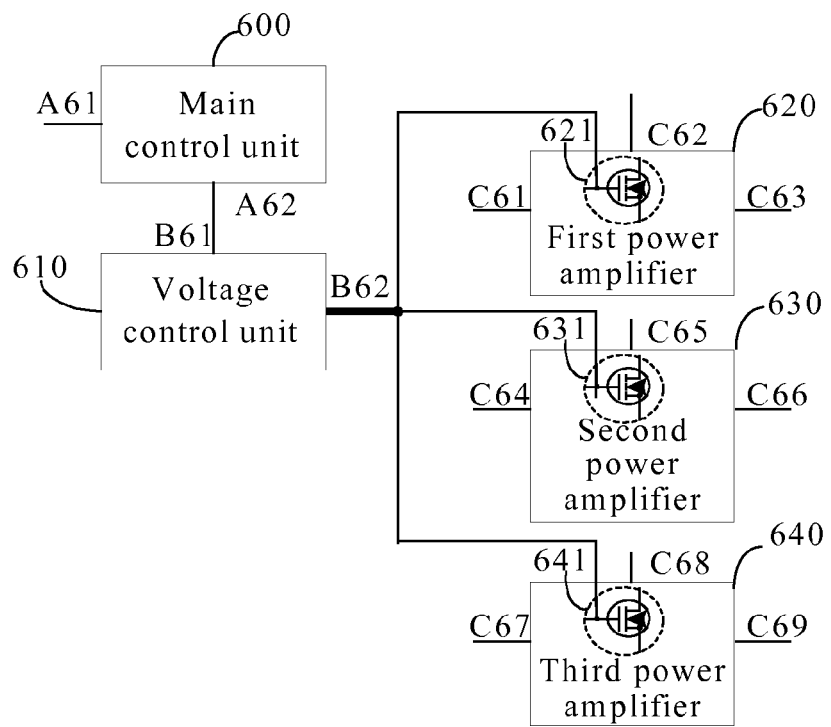
FIG. 10 is a schematic view of a system for controlling power amplification according to a fifth embodiment of the present invention, in which power amplifiers are operated independently or connected in parallel in operation.

A system for controlling power amplification is provided in a fifth embodiment of the present invention, in which multiple power amplifiers are operated independently or connected in parallel in operation. Referring to FIG. 10, the system includes a main control unit 600, a voltage control unit 610, and a power amplifier unit formed by a first power amplifier 620, a second power amplifier 630, and a third power amplifier 640.

A port A61 of the main control unit 600 is an information input port adapted to obtain information related to an NE. The information includes at least one of signaling, service information, external control signals, and internal clock signals of the NE. A current state of the NE is determined according to the above information.

The NE may be in an Idle state or a Busy state. The Idle state indicates that the NE is not required to output an RF signal, for example, the NE is not accessed by any subscriber, in an idle timeslot, or receives a control signal for turning off the power amplifier. The Busy state indicates that the NE is required to output an RF signal, for example, the NE is accessed by subscribers, in a non-idle timeslot, or receives a control signal for turning on the power amplifier.

The main control unit 600 sends a voltage control signal according to the state of the NE. For example, the voltage control signal corresponding to the Idle state is represented by a logic voltage "0", and the voltage control signal corresponding to the Busy state is represented by a logic voltage "1". Further, an inverse logic expression may also be adopted, that is, the voltage control signal corresponding to the Idle state is represented by a logic voltage "1", and the voltage control signal corresponding to the Busy state is represented by a logic voltage "0". The voltage control signal is output from a port A62. When the power amplifier unit is formed by multiple power amplifiers, the main control unit outputs multiple independent voltage control signals, and the logic expression of each voltage control signal is the same as the preceding description. The main control unit 600 may be an integrated chip or a functional module of an integrated chip. The main control unit may also be a part of a base station controller, and the voltage control signal is directly sent to a transmitter on a base station side through a signaling channel by the base station controller. The main control unit may also be directly integrated on a board of a transmitter.

The voltage control unit 610 is connected to the main control unit 600, and adapted to receive the voltage control signals from the main control unit 600 through a port B61, obtain voltage signals according to the voltage control signals, and apply the obtained voltage signals to grid electrodes of the power amplifier transistors 621, 631, and 641 or base electrodes of the power amplifier transistors 621, 631, and 641 through a port B62, respectively. Here, the port B62 can output three independent voltage signals to control the three power amplifiers independently, or output only one voltage signal to control the three power amplifiers uniformly. The value of the voltage signals varies for different power amplifier transistors. For example, when the power amplifier transistors are N-channel LDMOSs, the voltage signals corresponding to the voltage control signals "1" (the Busy state) may be 2 V to 5 V, and the voltage signals corresponding to the voltage control signals "0" (the Idle state) may be 0 V to 2 V. If the power amplifier transistors are N-channel depletion-mode GaAs MESFETs, the voltage signals corresponding to the voltage control signals "1" (the Busy state) may be −4 V to 0 V, and the voltage signals corresponding to the voltage control signals "0" (the Idle state) may be −5 V to −4 V. The voltage control unit may be formed by an analog switch circuit or a digital-to-analog converter circuit. The voltage control unit may be set separately or integrated in the main control unit or the power amplifier unit as a functional module.

When the first power amplifier 620, the second power amplifier 630, and the third power amplifier 640 operate independently, ports C61, C64, and C67 receive three independent RF signals, and ports C63, C66, and C69 output three amplified RF signals, respectively. Each of the power amplifiers is adapted to switch on or switch off according to the voltage signal applied to the grid electrode or the base electrode of the power amplifier transistor therein. The first power amplifier 620, the second power amplifier 630, and the third power amplifier 640 may respectively include one or more power amplifier transistors, and ports C62, C65, and C68 thereof are connected to a constant power supply voltage $V_{dd}$ respectively.

When the power amplifiers operate in parallel, the ports C61, C64, and C67 receive one RF signal, which is then divided into three signals. The three signals are amplified by the three power amplifiers, then combined by the ports C63, C66, and C69, and output as one RF signal. Each of the power amplifiers is adapted to switch on or switch off according to a bias voltage signal applied to the grid electrode or the base electrode of the power amplifier transistor therein. The first power amplifier 620, the second power amplifier 630, and the third power amplifier 640 may respectively include one or more power amplifier transistors, and the ports C62, C65, and C68 thereof are connected to a constant voltage $V_{dd}$ of a power source respectively. The main control unit controls, via the voltage signal, the number of the power amplifiers which are in the On state, according to the input RF power, so as to improve the overall efficiency of the power amplifier unit. For example, only one power amplifier switches on when the power of the input RF signal is small, and three power amplifiers are turned on when the power of the input RF signal is large. The three power amplifiers may be controlled uniformly by one voltage signal, so as to double the output power.

The first power amplifier 620, the second power amplifier 630, and the third power amplifier 640 may be Class A or Class AB amplifiers, and the power amplifier transistors therein include, but are not limited to, LDMOS, GaAs MESFET, BJT, JFET, or GAN transistors.

The main control unit outputs multiple voltage signals through the voltage control unit, which realizes the collective control over multiple power amplifiers, saves the equipment cost, and improves the efficiency of the power amplifiers.

The system for controlling power amplification is applicable to an RF transmitter, and is also applicable to an NE such as a base station or a wireless terminal.

Figure 11:
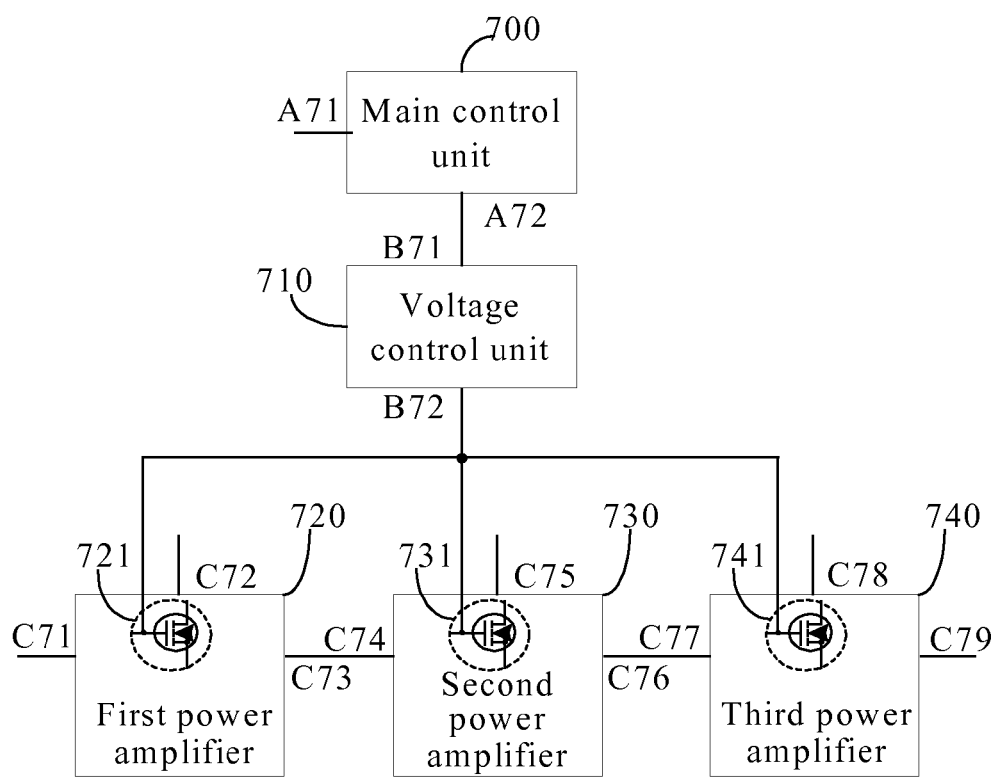
FIG. 11 is a schematic view of a system for controlling power amplification according to a sixth embodiment of the present invention, in which power amplifiers are connected in series in operation.

Sometimes, multiple power amplifiers need to be connected in series in operation to obtain a higher gain. A system for controlling power amplification is provided in a sixth embodiment of the present invention, in which power amplifiers are connected in series in operation. Referring to FIG. 11, the system includes a main control unit 700, a voltage control unit 710, and a power amplifier unit formed by a first power amplifier 720, a second power amplifier 730, and a third power amplifier 740.

A port A71 of the main control unit 700 is an information input port adapted to obtain information related to an NE. The information includes at least one of signaling, service information, external control signals, and internal clock signals of the NE. A current state of the NE is determined according to the above information.

The NE may be in an Idle state or a Busy state. The Idle state indicates that the NE is not required to output an RF signal, for example, the NE is not accessed by any subscriber, in an idle timeslot, or receives a control signal for turning off the power amplifier. The Busy state indicates that the NE is required to output an RF signal, for example, the NE is accessed by subscribers, in a non-idle timeslot, or receives a control signal for turning on the power amplifier.

The main control unit 700 sends a voltage control signal according to the state of the NE. For example, the voltage control signal corresponding to the Idle state is represented by a logic voltage "0", and the voltage control signal corresponding to the Busy state is represented by a logic voltage "1". Further, an inverse logic expression may also be adopted, that is, the voltage control signal corresponding to the Idle state is represented by a logic voltage "1", and the voltage control signal corresponding to the Busy state is represented by a logic voltage "0". The voltage control signal is output from a port A72. If the power amplifier unit is formed by multiple power amplifiers, the main control unit outputs multiple independent voltage control signals, and the logic expression of each voltage control signal is the same as the preceding description. The main control unit 700 may be an integrated chip or a functional module of an integrated chip. The main control unit may also be a part of a base station controller, and the voltage control signal is directly sent to a transmitter on a base station side through a signaling channel by the base station controller. The main control unit may also be directly integrated on a board of a transmitter.

The voltage control unit 710 is connected to the main control unit 700, and adapted to receive the voltage control signals from the main control unit 700 through a port B71, obtain voltage signals according to the voltage control signals, and apply the obtained voltage signals to grid electrodes of the power amplifier transistors 721, 731, and 741 or base electrodes of the power amplifier transistors 721, 731, and 741 through a port B72, respectively. Here, the port B72 can output three independent voltage signals to control the three power amplifiers independently, or output only one voltage signal to control the three power amplifiers uniformly. In addition, for the power amplifiers connected in series, the voltage signal may be applied to individual power amplifiers. For example, in this embodiment, the voltage signal is applied to only the grid electrode of the power amplifier transistor 741 in the last power amplifier 740. The value of the voltage signal varies for different power amplifier transistors. For example, If the power amplifier transistors are N-channel LDMOSs, the voltage signals corresponding to the voltage control signals "1" (the Busy state) may be 2 V to 5 V, and the voltage signals corresponding to the voltage control signals "0" (the Idle state) may be 0 V to 2 V. When the power amplifier transistors are N-channel depletion-mode GaAs MESFETs, the voltage signals corresponding to the voltage control signals "1" (the Busy state) may be −4 V to 0 V, and the voltage signals corresponding to the voltage control signals "0" (the Idle state) may be −5 V to −4 V. The voltage control unit may be formed by an analog switch circuit or a digital-to-analog converter circuit. The voltage control unit may be set separately or integrated in the main control unit or the power amplifier unit as a functional module.

The first power amplifier 720, the second power amplifier 730, and the third power amplifier 740 are connected in series in operation, and each of the power amplifiers switch on or switch off according to a bias voltage signal applied to the grid electrode or the base electrode of the power amplifier transistor therein. The first power amplifier 720, the second power amplifier 730, and the third power amplifier 740 may respectively include one or more power amplifier transistors. A port C71 is an RF signal input terminal, ports C73 and C74 are connected, ports C76 and C77 are connected such that the RF signals are amplified on three stages and output from a port C79, and ports C72, C75, and C78 are connected to a constant voltage $V_{dd}$ of a power supply respectively.

The first power amplifier 720, the second power amplifier 730, and the third power amplifier 740 may be Class A or Class AB amplifiers, and the power amplifier transistors therein include, but are not limited to, LDMOS, GaAs MESFET, BJT, JFET, or GAN transistors.

The system for controlling power amplification is applicable to an RF transmitter, and is also applicable to an NE such as a base station or a wireless terminal.

A device for controlling power amplification is provided in a seventh embodiment of the present invention. The device includes a main control unit and a voltage control unit. The main control unit is adapted to obtain the state of an NE, and send a voltage control signal according to the state. The voltage control unit is adapted to output a voltage signal to a grid electrode or a base electrode of a power amplifier transistor in a power amplifier unit according to the voltage control signal.

The main control unit further includes an information acquisition module, a state acquisition module, and a signal sending module.

The information acquisition module is adapted to acquire information related to the equipment. The information is signaling, service information, control signals, or internal clock signals.

The state acquisition module is adapted to acquire the state of the equipment according to the above information.

The signal sending module is adapted to send the voltage signal according to the state of the equipment.

Though several specific embodiments of the present invention are disclosed above, the present invention is not limited thereto. Various modifications and variations that can be thought of by persons skilled in the art shall fall within the protective scope of the present invention.

What is claimed is:

1. A method for controlling power amplification on a network equipment, wherein a transmitting time slot is assigned for the network equipment to transmit a signal to a user equipment through a power amplifier, the method comprising:
    determining, by the network equipment, whether the network equipment is accessed by the user equipment during the assigned transmitting time slot; and
    if the network equipment is not accessed by the user equipment during the assigned transmitting time slot, outputting, by the network equipment, a first voltage signal to a grid electrode or a base electrode of at least one power amplifier transistor in the power amplifier to enable the power amplifier transistor to switch off during the assigned transmitting time slot.

2. The method of claim 1, wherein whether the network equipment is accessed by the user equipment is determined by the network equipment according to information related to the network equipment.

3. The method of claim 2, wherein the information related to the network equipment comprises at least one of a signaling, service information, an external control signal and an internal clock signal of the network equipment.

4. The method of claim 1, further comprising, if the network equipment is accessed by the user equipment during the assigned transmitting time slot, outputting, by the network equipment, a second voltage signal to the grid electrode or the base electrode of the at least one power amplifier transistor in the power amplifier to enable the power amplifier transistor to switch on during the assigned transmitting time slot and transmitting the signal to the user equipment through the power amplifier.

5. The method of claim 1, wherein the network equipment is a base station.

6. A power amplification controller used in a network equipment, wherein a transmitting time slot is assigned for the network equipment to transmit a signal to a user equipment through a power amplifier, the power amplification controller comprising:
    a state acquisition module, configured to determine whether the network equipment is accessed by the user equipment during the assigned transmitting time slot; and
    a signal sending module, configured to send a corresponding voltage control signal according to a result determined by the state acquisition module;

wherein if it is determined by the state acquisition module that the network equipment is not accessed by the user equipment during the assigned transmitting time slot, the corresponding voltage control signal sent by the signal sending module enables a voltage control unit to output a first voltage signal to a grid electrode or a base electrode of at least one power amplifier transistor in the power amplifier to enable the power amplifier transistor to switch off during the assigned transmitting time slot.

7. The power amplification controller of claim 6, wherein whether the network equipment is accessed by the user equipment is determined by the state acquisition module according to information related to the network equipment.

8. The power amplification controller of claim 7, wherein the information related to the network equipment comprises at least one of a signaling, service information, an external control signals and an internal clock signals of the network equipment.

9. The power amplification controller of claim 6, wherein if it is determined by the state acquisition module that the network equipment is accessed by the user equipment during the assigned transmitting time slot, the corresponding voltage control signal sent by the signal sending module enables the voltage control unit to output a second voltage signal to the grid electrode or the base electrode of the at least one power amplifier transistor in the power amplifier to enable the power amplifier transistor to switch on during the assigned transmitting time slot.

10. The power amplification controller of claim 6, wherein the network equipment is a base station.

11. A network equipment for controlling power amplification, wherein a transmitting time slot is assigned for the network equipment to transmit a signal to a user equipment through a power amplifier, the network equipment comprising:
   a main control unit, configured to determine whether the network equipment is accessed by the user equipment during the assigned transmitting time slot and, if the network equipment is not accessed by the user equipment during the assigned transmitting time slot, to output a first voltage signal to a grid electrode or a base electrode of at least one power amplifier transistor in the power amplifier to enable the power amplifier transistor to switch off during the assigned transmitting time slot; and
   the power amplifier, configured to switch off according to the first voltage signal output to the grid electrode or the base electrode of the at least one power amplifier transistor in the power amplifier.

12. The network equipment of claim 11, wherein whether the network equipment is accessed by the user equipment is determined by the main control unit according to information related to the network equipment.

13. The network equipment of claim 12, wherein the information related to the network equipment comprises at least one of a signaling, service information, an external control signal and an internal clock signal of the network equipment.

14. The network equipment of claim 11, wherein the power amplifier comprises at least two sub power amplifiers, wherein the at least two power amplifiers are connected in parallel or in series.

15. The network equipment of claim 11, wherein the network equipment is a base station.

16. The network equipment of claim 11, wherein:
   the main control unit is further configured to output a second voltage signal to the grid electrode or the base electrode of the at least one power amplifier transistor in the power amplifier to enable the power amplifier transistor to switch on during the assigned transmitting time slot, if the network equipment is accessed by the user equipment during the assigned transmitting time slot; and
   the power amplifier is further configured to switch on according to the second voltage signal output to the grid electrode or the base electrode of the at least one power amplifier transistor in the power amplifier.

* * * * *